(12) United States Patent
Butler

(10) Patent No.: US 7,505,114 B2
(45) Date of Patent: Mar. 17, 2009

(54) LITHOGRAPHIC APPARATUS AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 230 days.

(21) Appl. No.: 11/314,165

(22) Filed: Dec. 22, 2005

(65) Prior Publication Data

US 2007/0146675 A1 Jun. 28, 2007

(51) Int. Cl.
*G03B 27/42* (2006.01)
(52) U.S. Cl. .............................. 355/53; 355/72; 355/75
(58) Field of Classification Search .................. 355/53, 355/55, 72, 75; 356/399, 400; 702/149, 702/150; 712/239; 324/614
See application file for complete search history.

(56) References Cited

U.S. PATENT DOCUMENTS 6,373,072 B1 * 4/2002 Butler et al. ............ 250/492.24
6,714,842 B1 * 3/2004 Ito .............................. 700/302
6,727,977 B2 * 4/2004 Butler ........................... 355/53
6,984,836 B2 * 1/2006 Lyons ......................... 250/548
2002/0120656 A1 * 8/2002 Jabbari et al. ............... 708/300

* cited by examiner

*Primary Examiner*—Diane I Lee
*Assistant Examiner*—Steven H Whitesell-Gordon
(74) *Attorney, Agent, or Firm*—Sterne, Kessler, Goldstein & Fox P.L.L.C.

(57) ABSTRACT

A lithographic apparatus includes a first component; an actuator to move the first component relative to a second component; a measurement system to measure at least one of a position, velocity, acceleration and higher order time derivatives of the position; and a control system to control the actuator according to an output of the measurement system. The control system includes various filter branches, each branch acting on an output of the measurement system and determining therefrom characteristic parameters of a different one of a plurality of pre-determined independent variables of a first analytical expression of the output; and a prediction unit that the characteristic parameters and the first analytical expression to provide a version of the output that is time-shifted to at least partially compensate for a delay between a measurement of a property of the second component and the effect of the measurement on an operation of the actuator.

6 Claims, 20 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Control systems using feedforward may be used to control relative movement of various components of the lithographic apparatus. For example, such a system may be used to control the motion of a substrate table based on feedforward of a measurement of the acceleration of a projection system (which may vibrate due to noise excitation for example). As a further example, a feedforward control system may be used to control the relative motion of a reticle and the substrate table. The performance of such systems may be limited due to delays in the feedforward branch, or, more generally, time lags between a reaction of a controlled component to the feedforward and a corresponding change in the reference signal.

SUMMARY

It is desirable to provide an improved control system for a lithographic apparatus.

According to an embodiment of the invention, there is provided a lithographic apparatus, including: a first moveable component; an actuator capable of moving the first component relative to a second component; a measurement system arranged to measure at least one of the following properties of the second component: position, velocity, acceleration and higher order time derivatives of the position; and a control system configured to control the actuator according to an output from the measurement system, wherein the control system includes: a plurality of filter branches, each branch configured to act on an output from the measurement system and determine therefrom characteristic parameters of a different one of a plurality of pre-determined independent variables of a first analytical expression of the output from the measurement system; and a prediction unit, configured to use the characteristic parameters determined by the plurality of filter branches and the first analytical expression to provide a version of the output that is time-shifted to at least partially compensate for a delay between a measurement of a property of the second component by the measurement system and the effect of the measurement on an operation of the actuator as controlled by the control system.

According to a further embodiment of the invention, there is provided a device manufacturing method, including: providing a first moveable component; providing an actuator to move the first component relative to a second component; providing a measurement system to measure at least one of the following properties of the second component: position, velocity, acceleration and higher order time derivatives of the position; and providing a control system to control the actuator according to an output from the measurement system, the control system including: a plurality of filter branches, each branch acting on an output from the measurement system and determining therefrom characteristic parameters of a different one of a plurality of pre-determined independent variables of a first analytical expression of the output from the measurement system; and a prediction unit that uses the characteristic parameters determined by the plurality of filter branches and the first analytical expression to provide a version of the output that is time-shifted to at least partially compensate for a delay between a measurement of a property of the second component by the measurement system and the effect of the measurement on an operation of the actuator as controlled by the control system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
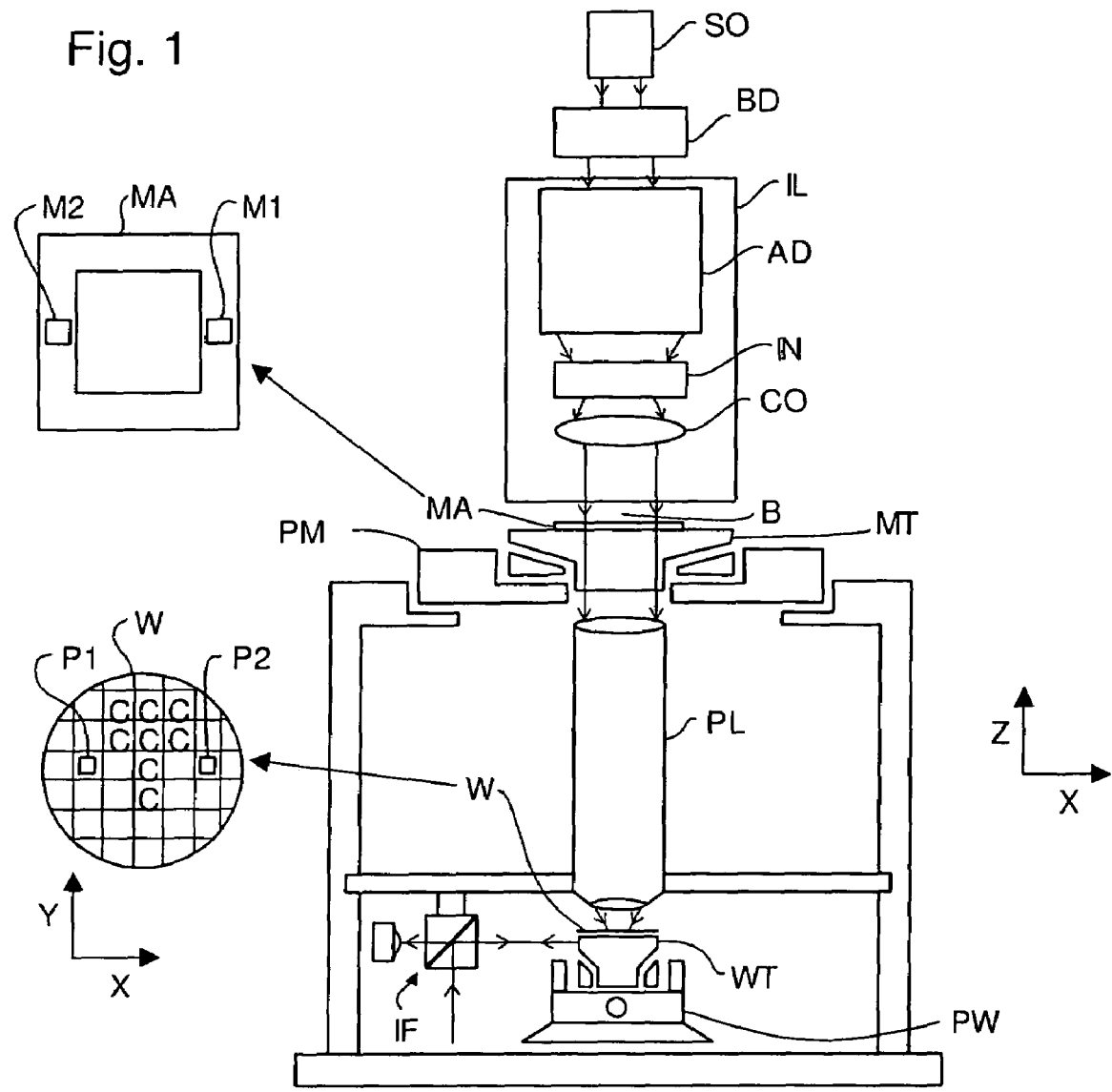
FIG. 1 depicts a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g., UV radiation or DUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PL configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B. e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Feedforward control systems may be used in various situations to control a force to be applied to a moveable component in order that it follow a change in position, velocity and/or acceleration of a reference component. For example, such a control system may be arranged to control movement of a substrate table WT by reference to a measured position of a component of a projection system. Alternatively or additionally, the feedforward system may be arranged to control the movement of a support MT for a patterning device MA by reference to a measured error in a substrate table position or vice versa.

Control systems that rely on feedforward of external signals may be subject to problems from delay in the feedforward branch and/or elsewhere. This may occur for a number of reasons but is often the result of necessary processing of the measured signal, before it is input to the force actuation system. As a specific example, the feedforward signal may have to be filtered by an analogue anti-aliasing filter. Additionally or alternatively, the feedforward signal may have to pass a zero-order hold system (for example a digital to analogue converter), which may involve an average delay of 0.5 samples, for example, before causing a reaction. Further filters may also be included, which may also contribute to delay.

Where the signal to the feedforward branch is a generated set-point, feedforward delay or "time lag" is easy to avoid because the set-point signal may easily be shifted in time with respect to the reference according to the expected time lag. For example, the reaction to the feedforward may be shifted so as to match the change in the reference as closely as possible. However, where the input to the feedforward branch originates from a measurement, the signal cannot easily be shifted forward in time because this requires a prediction of the physical parameter that is being measured.

Feedforward Compensation of Lens Acceleration

Figure 2:
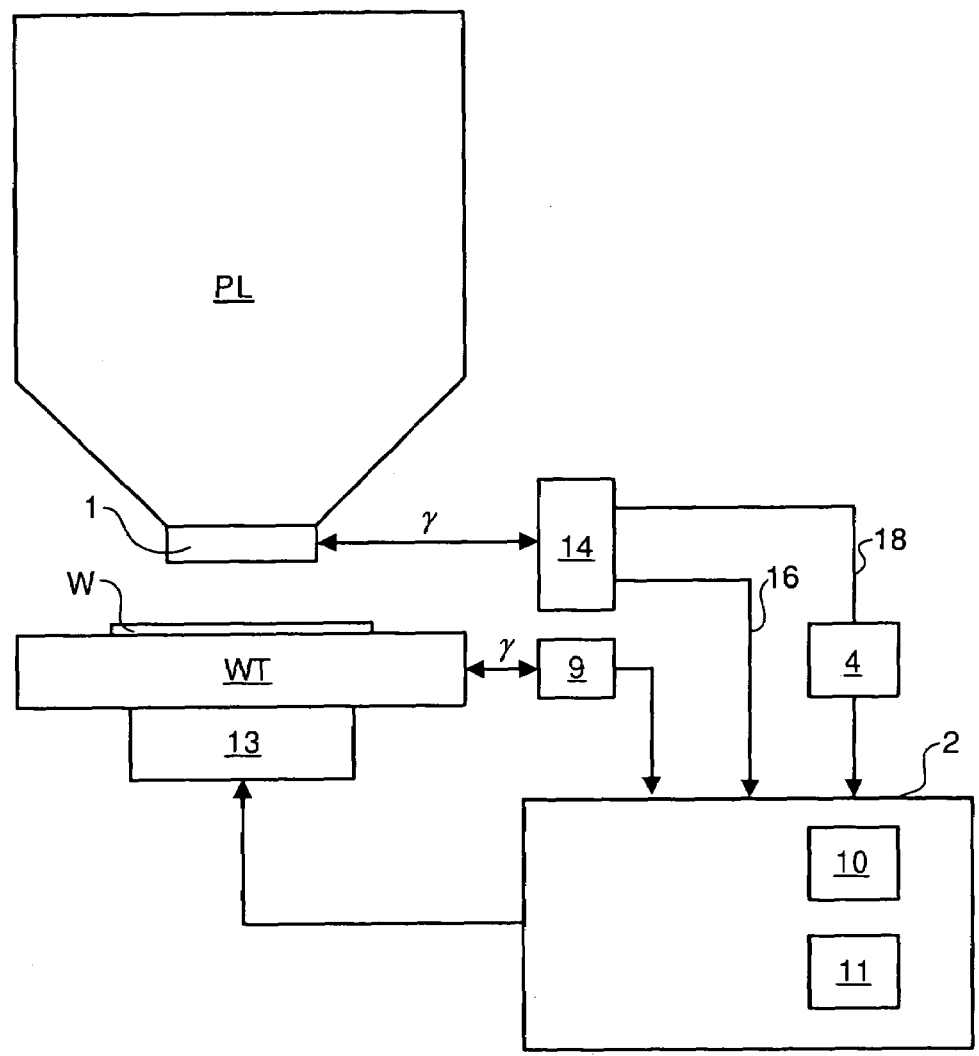
FIG. 2 depicts a lithographic apparatus including a control system for feedforward control of a substrate table movement relative to a lens acceleration.
Figure 3:
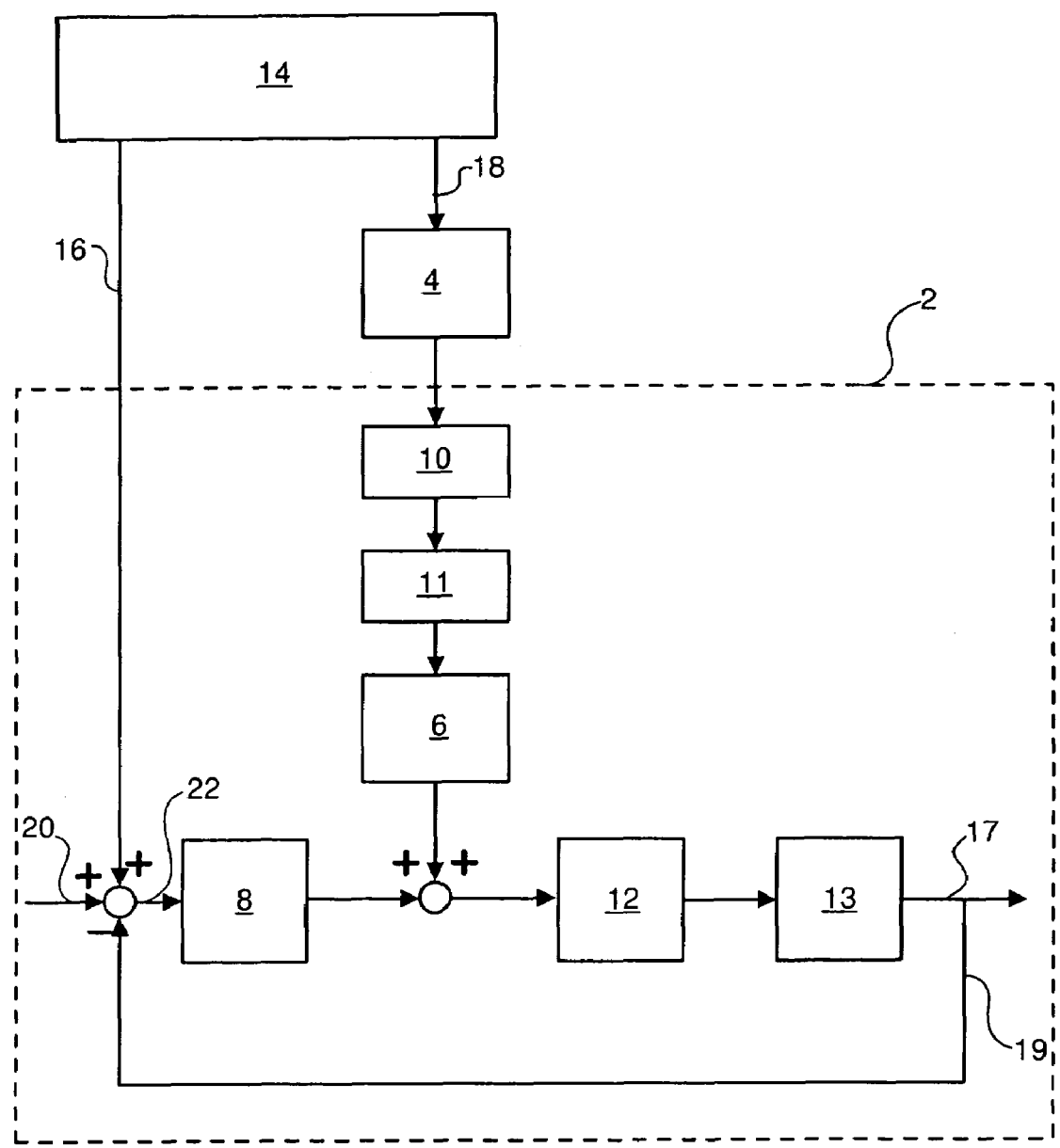
FIG. 3 depicts a detailed view of the control system of FIG. 2.

FIGS. 2 and 3 depict a feedforward system according to an embodiment of the invention for controlling movement of the substrate table WT by reference to a measured state of a lens 1.

The arrangement shown in FIG. 2 includes a measurement system 14 configured to measure a state (acceleration, velocity, position and/or higher time derivatives of the position) of the lens 1. In the present embodiment, the measurement system 14 is configured to measure the lens position and acceleration, respective outputs being shown as data lines 16 and 18. A feedforward control system 2 is provided for controlling the movement of the substrate table WT via force actuator 13. The control system 2 includes a plurality of filter branches 10 and a prediction unit 11, which will be described in more detail below. The connections within the control system 2 are illustrated in FIG. 3. The plurality of filter branches 10 and the prediction unit 11 are configured at least partially to compensate for a delay between the measurement of a state of the lens 1 and the effect of the measurement on an operation of the force actuator 13 (i.e., the time taken for the control system to cause the actuator 13 to react to the measurement). The substrate table position may be measured using interferometer 9, for example. The function of the filter 4 is described below.

FIG. 3 shows in more detail how the control system 2 may be configured to carry out substrate table position control in this embodiment. In this arrangement, the substrate table force actuator 13 is controlled by controller 8. An extra filter 12 (for example a notch filter) is also present in the loop. Filter 12 is used to create a stable control loop for all frequencies, and can for example be tuned to compensate for dynamics in the substrate table transfer function. A reference 20 is provided to act as an initial set-point position. The lens 1 position and acceleration are measured by measurement system 14 and input to the control system 2 via data transfer paths 16 and 18 respectively, as described above. The lens position 16 is added to the control loop reference 20. This way, any lens movements are input to the substrate table position control loop, such that the substrate table WT follows the lens movements for frequencies inside the substrate table control loop bandwidth. This ensures that the image being projected by projection lens PL onto the substrate W remains in the same position with respect to the substrate W. The lens acceleration signal 18 passes through filter 4, and then passes through the plurality of filter branches 10 and prediction unit 11, is multiplied by a substrate table mass in stage 6, and added to the output from controller 8. The filter 4 may partly represent analogue filtering of the accelerometer signal, and may also include possible digital filters to shape the feed-forward correctly. Hence, filter 4 may actually contain an analogue filter in addition to digital filtering in a motion control computer. The position of the lens 16 may be measured using an interferometer beam while the acceleration of the lens 18 may be measured by an accelerometer. These measurement devices may be implemented as separate units or as an integral unit and are together referred to as the measurement system 14. Multiplication of the output of predictor 11 with the substrate table mass is needed to calculate a force to be provided by force actuator 13 in order to obtain the required acceleration. Note that actuator 13 represents not only a physical actuator like a Lorenz motor, but also includes all characteristics of substrate table WT, and related electronic components like amplifiers, digital-to-analogue converters, etc. In the control system of FIG. 3, the block 13 represents the complete transfer function of a desired force on the output of filter 12, to the substrate table position measurement 17.

An aim of the feedforward system is to make the substrate table WT react to the measured acceleration 18 of the lens 1 in such a way that the measured position 17 of the substrate table WT, which is supplied to the input of the controller 8 via feedback loop 19, matches a target position defined relative to the measured position of the lens 16 (for example, so as to maintain a constant alignment between the lens and the substrate table WT). In other words, the aim is that the substrate table WT follows the lens perfectly, and the substrate table controller 8 is not disturbed by this movement in any way. This can best be explained by considering a lens movement, while the set-point position that defines the desired position of the substrate table with respect to the lens, 20, is zero. A lens movement position is detected by, e.g., an interferometer, represented by branch 16 in FIG. 3. At the same time, the lens movement acceleration is detected by, e.g., an accelerometer, as indicated by branch 18. The force that is required to move the substrate table WT according to the measured lens position 16, equals the lens acceleration 18 multiplied by the mass of the substrate table. By exerting this force on the substrate table WT via branch 18, filter 12 and actuator 13, a substrate table movement 17 is generated that matches lens movement position 16. Because the measured substrate table position 17 is subtracted from lens movement position 16 in the subtractor, the servo error 22 is not influenced by lens movements, and remains zero. This implies a perfect tracking of the substrate table position with respect to lens movements.

As mentioned above, the analogue filtering of the output 18 of the accelerometer by filters 4 and/or 6 may introduce phase lag (time lag) to the signal. Filter 12 will also contribute to this effect. Also, in a digital system some delay is present due to, for example, the digital-to-analogue converters that may be provided to perform a zero-order hold function, calculation delay, etc. The result of these delays, in the absence of the plurality of filter branches 10 and prediction unit 11, is that the position 17 of the substrate table WT in response to the feedforward lags behind the position of the lens 1, hence creating a servo error 22.

One approach to tackling this problem is to add lead-lag filters to the filter 4 so as to introduce "phase advantage" at the dominant lens frequencies. However, these filters may introduce extra gain at higher frequencies, amplifying high-frequency noise. A generally used lead-lag filter has the following transfer function:

$$H(s) = \frac{\omega_P^2}{\omega_Z^2} \cdot \frac{s^2 + 2d_Z s + \omega_Z^2}{s^2 + 2d_P s + \omega_P^2}$$

In this equation, $\omega_Z$ is the "zero frequency", $\omega_P$ is the "pole frequency" (both in radians per second), and $d_Z$ and $d_P$ are the zero damping and pole damping, respectively. By choosing $\omega_Z < \omega_P$, the region between $\omega_Z$ and $\omega_P$ shows a positive phase behaviour, and hence creates a "phase lead" that can partly compensate for delays in the feedforward branch in this frequency region. However, it can be seen in the above equation that for high frequencies, the filter gain equals $\omega_P^2/\omega_Z^2$, which is larger than 1. Hence, for high frequencies such a lead-lag filter creates a amplification of the feedforward signal that is too large. There is therefore a performance cost associated with using lead-lag filters to compensate for signal delay. According to an embodiment of the present invention, an improved performance is provided by the combination of the plurality of filter branches 10 and predictor unit 11, the operation of which is described in further detail below.

Feedforward Control of Substrate Table to Follow Support for Patterning Device

Figure 4:
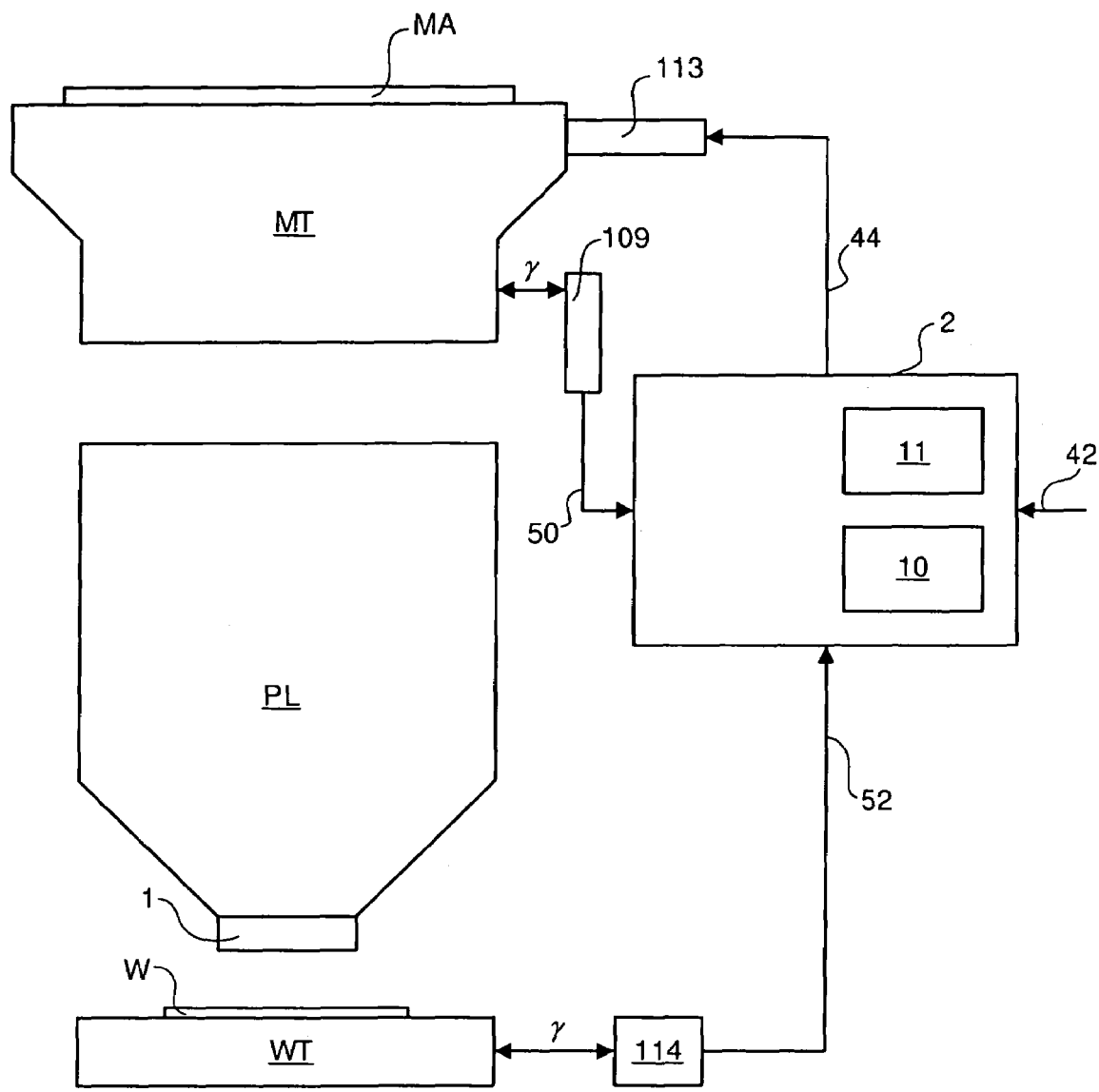
FIG. 4 depicts a lithographic apparatus including a control system for feedforward control of a patterning device support movement relative to a substrate table.
Figure 5:
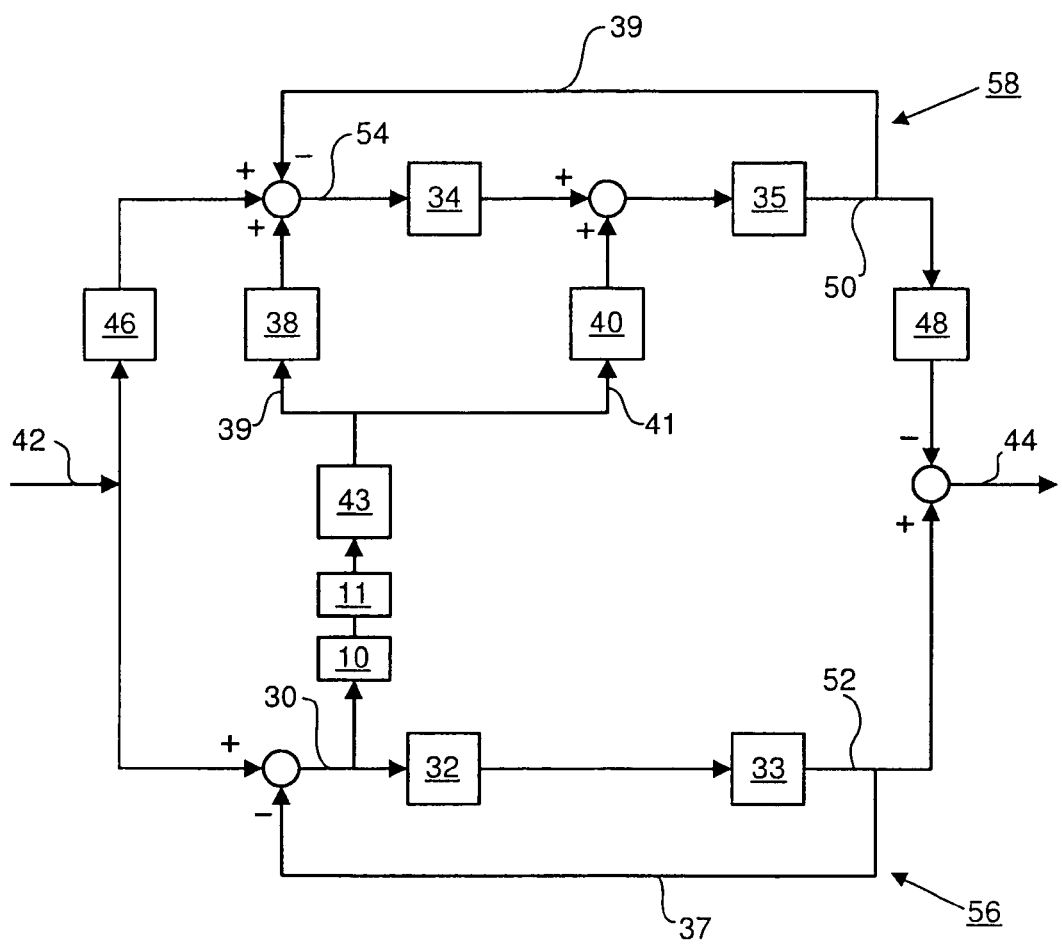
FIG. 5 depicts a detailed view of the control system of FIG. 4.

FIGS. 4 and 5 depict a feedforward system according to an embodiment of the invention for controlling movement of a support MT for a patterning device MA by reference to a measured state of the substrate table WT.

The arrangement shown in FIG. 4 includes a measurement system 114 configured to measure the state (e.g., position, velocity, acceleration and/or further time derivative of the position) of the substrate table WT. A feedforward control system 2 is provided for controlling the movement of the support MT via force actuator 113. The control system 2 includes a plurality of filter branches 10 and a prediction unit 11 which will be described in more detail below. The connections within control system 2 are illustrated in FIG. 5. The patterning device support position may be measured using interferometer 109, for example.

FIG. 5 shows a feedforward arrangement for the apparatus of FIG. 4. In this arrangement, the apparatus is arranged to feed an error 30 (defined as the difference between an external set-point 42 and a measured position of the substrate table 52) from the substrate table control loop 56 to the patterning device support control loop 58 by means of two signal branches 39 and 41 via stages 10, 11 and 43. Branch 39 is configured to multiply error 30 by a factor K in stage 38, which may be arranged to be equal to the lens magnification (in this case 4×) in order to create a movement of the support MT that is four times as large as that of the substrate table WT. In addition, also in stage 38, low-pass filtering by a filter 1/D is applied. The second branch 41 is arranged to doubly differentiate the substrate table control error 30, in stage 40, in order to create a required patterning device support MT acceleration. Stage 40 is then configured to multiply this acceleration by the patterning device support mass M and the lens magnification K and, finally, apply the same low-pass filtering 1/D that was applied in stage 38 of branch 39. Similar to the feedforward compensation of lens acceleration described before, the design is such that movement of device support MT as a reaction to the feedforward branch 41 is such that it matches the addition to the control loop input, the output of block 38.

An external set-point is provided via input 42 which is fed (after multiplication by a magnification factor in stage 46) to an input of the patterning device support control loop 58 and to an input of the substrate table control loop 56 (as mentioned above). Each of the control loops 56 and 58 includes a controller 32, 34 and a force actuator system 33, 35 with a feedback loop 37, 39 feeding back a measurement of the substrate table position 52 and the patterning device position 50 to the inputs of the respective control loops 56 and 58. Again, force actuators 33 and 35 include all aspects of a transfer function from a force generated by a controller, to an actual movement of the object. The measured position of the substrate table 52 and the patterning device position 50, which is passed via stage 48, provides the relative position error 44.

The second branch 41 is configured to calculate the required force on the patterning device support MT such that it moves in accordance with the signal from the first branch 39 added to the reference set-point. The aim of this arrangement is to ensure that the patterning device support control error 54 remains zero. As with the lens feedforward situation discussed above with reference to FIGS. 2 and 3, the feedforward path to the actual measured displacement 50 may suffer from some delay. In the present arrangement, this may be caused principally by the double differentiation step 40, which, when implemented digitally, introduces one sample delay. In addition, the low pass filtering step in stage 40, the zero-order hold circuit within block 35, and the mechanical transfer function in block 35, which may not behave like a perfectly rigid mass, introduce extra delay. The end result is that the patterning device support control error 54 is not equal to zero, and hence the loop sensitivity starts influencing the overall performance. This may be partly solved by introducing extra delay in the first branch 38, but this approach means that the the support MT may no longer actually follow substrate table WT. By including a delay in branch 38, the additional setpoint to control loop 58 is delayed in accordance with existing delay in feedforward branch 41. This means that the servo error 54 may become zero, but support MT position 50 is actually delayed compared to substrate table WT position 52, and hence the relative position error 44 may actually become larger. One possible approach, as discussed above in respect of controlling the substrate table WT position with respect to lens position, is to introduce lead-lag filters around the main frequencies in the substrate table control loop error 30 to create phase advantage. Again, however, this leads to undesired high-frequency gain. According to an embodiment of the present invention, a solution is provided by compensating for the expected delay using the plurality of filter branches 10 and the prediction unit 11 (described in more detail below), which in the present example are configured to time-shift the error signal 30. Note that the plurality of filter branches 10 and the prediction unit 11 may also be inserted in branch 41 instead of the place indicated in FIG. 5. By compensating delay in branch 41, the reaction of support MT to the feedforward in branch 41 comes earlier in time, hence better matching the position setpoint of branch 38. The prediction unit 11 may directly predict the acceleration of the input of filter branches 10, taking away the need for a double differentiating unit in block 40.

Plurality of Filter Branches 10 and Prediction Unit 11

According to an embodiment of the invention, the control system 2 is adapted at least partially to compensate for time delays based on a prediction of the feedforward value one (or more) sample period(s) ahead. Such a prediction may be difficult if the feedforward signal is completely random or contains strong random components. However, in many cases, and in both of the cases described above, the signal has some strong peaks in the frequency domain and hence can be described adequately by a summation of sinusoids:

$$x(t) = \sum_{i=1\ldots m} a_i \cos(\omega_i t) + b_i \sin(\omega_i t)$$

This may be the case due to the existence of natural oscillating frequencies of the components being measured or because driving frequencies are present. If the coefficient $a_i$ and $b_i$ are known, a prediction of $x(t+\Delta t)$, where $\Delta t$ is the delay interval (or a fraction of it), can be made by inserting $t+\Delta t$ in the above formula. One possible prediction method is to estimate the coefficients based on a number of previous samples of measurement data and then carry out extrapolation. A prediction algorithm of this type may achieve prediction at the frequencies chosen with high accuracy if a sufficiently large number of samples are taken. Implementation may be achieved using a finite impulse response (FIR) filter structure. However, for higher frequencies an undesired high-frequency gain is present, especially if the number of prediction frequencies becomes large.

An example of a simple predictor that uses extrapolation illustrates this phenomenon. Assume a predictor uses the current input, $x(k)$, and the previous input, $x(k-1)$, to predict the value one sample in the future: $x(k+1)$. A possible prediction uses the current value, $x(k)$, and adds the difference between the current and previous sample, hence assuming the same difference will be present between $x(k+1)$ and $x(k)$:

$$\hat{x}(k+1) = x(k) + (x(k) - x(k-1))$$

Using a sampling period Ts, a continous-time equivalent would be:

$$\hat{x}(j\omega) = (1 + j\omega T_S) x(j\omega)$$

It can be seen that for low frequencies the magnitude of the predictor output: $|1+j\omega T_S|$ is approximately 1, while for higher frequencies it increases proportionally with the frequency. When more input samples from the past, e.g., $x(k-2)$, $x(k-3)$, etc., are used in the predictor, this effect becomes even larger.

A convenient way of describing filter behavior is by reference to the transfer function $H(z)$, which provides an algebraic representation of a linear, time-invariant discrete-time filter in the (complex) frequency domain. $H(z)$ is defined, in this situation, as $Y(z)/X(z)$, where $Y(z)$ denotes the z transform of the filter output signal $y(n)$, and $X(z)$ denotes the z transform of the filter input signal $x(n)$.

According to an embodiment of the invention, a plurality of filter branches 10 is provided based on a Frequency Sampling Filter (FSF) design. The FSF design is based on specifying the desired filter behaviour at a number (N) of equispaced frequencies ($\omega_k = k \cdot \omega_0$ for $k=0 \ldots N-1$; for example, a principle oscillation frequency and its harmonics). The approach then produces a FIR filter that matches the desired transfer function exactly at these frequencies. At other frequencies, the behaviour is in principle undefined, but in practice a "smooth" transfer behaviour between these frequencies usually arises. Defining the specified frequency response at the kth frequency as H(k), (H(k) is a complex number) and for simplicity assuming a sampling period of one second:

$$H(k)=H(e^{j\omega})|_{\omega=(2\pi/N)k}=H(z)|_{z=e^{j(2\pi/N)k}}$$

This is due to the direct correspondence between the general frequency response $H(\omega)$ of the filter and the behaviour of the transfer function H(z) on the unit circle $z=\exp(j\omega)$.

It can be calculated that a filter transfer function H(z) can be described by H(k) as follows:

$$H(z) = \frac{1-z^{-N}}{N}\sum_{k=0}^{N-1}\frac{H(k)}{1-e^{j(2\pi/N)k}z^{-1}}$$

In other words, the filter transfer function H(z) can directly be expressed by the desired frequency response points H(k), as a summation of N filters. The operation of these filters can best be explained by re-writing this equation to:

$$H(z) = \frac{1}{N}\frac{z^N-1}{z^{N-1}}\sum_{k=0}^{N-1}\frac{H(k)}{z-e^{j(2\pi/N)k}}$$

The roots of the numerator polynomial, $z^N-1$, that is common for all filters, all lie on the unit circle, at the same equispaced frequencies where H(k) is defined (as indicated above, there is a direct correspondence between H(z) on the unit circle and the frequency response H(k)). The same holds for each of the denominator poles in filters k=0 ... N-1. Now, an input signal containing a combination of the equispaced frequencies, passes through all of the N filters. The $k^{th}$ filter has zeros on all equispaced frequencies (due to the numerator polynomial $z^N-1$), except on the $k^{th}$ frequency (due to the denominator $z-e^{j(2\pi/N)k}$ that cancels the $k^{th}$ zero in numerator polynomial $z^N-1$), where the response equals H(k). Hence, the $k^{th}$ frequency only passes the $k^{th}$ filter and does not cause a response in the other filters. Because the $k^{th}$ filter has a response H(k), the overall response is also H(k).

Hence, for each $H_k(z)$, a pole is positioned on the $k^{th}$ zero that cancels this zero. This results in a filter transfer of 1 for $\omega=(2\pi/N)k$. Multiplication by the desired frequency response H(k) guarantees that at each of the equispaced frequencies, the correct filter transfer results. As mentioned above, the resulting filter matches the desired response exactly at the equispaced frequencies. In between, the response is undefined. Note that in the denominator in the above equation, only one complex pole at $z=e^{j(2\pi/N)k}$ is present. Because usually H(k) and H(N−k−1) are complex conjugates, the summation of the filters $H_k(z)$ and $H_{N-k-1}(z)$ has complex conjugate poles. In that case, the output of the filter H(z) is a real value when its input is a real value.

Example of Operation of FSF Arrangement

The arrangement described above is most easily implemented where the control error has one basic frequency (derived from a driving frequency of some kind or a natural oscillation frequency of the system) and its higher harmonics (which will then be equispaced). The basic strategy in this scenario is as follows.

First, the base frequency that plays a role in the application is determined. The higher harmonics then automatically follow as "equispaced" frequencies on which the filter is designed. Possibly, the sampling period of the controller is adjusted.

For each of these N frequencies (base and higher harmonics), a filter is designed for which H(k) equals 1 at the frequency in question ($\omega=(2\pi/N)k$). In a complex plot of H(z) (i.e., a plot having axes representing the real and imaginary components of z), the filter will have zeros uniformly distributed over the unit circle at positions corresponding to the basic frequency and all of its harmonics, except on the harmonic for which the specific filter is designed. Hence, this filter does not pass the other harmonics, but only the one the filter is designed for. The $k^{th}$ filter then becomes:

$$H_k(z) = \frac{1-z^{-N}}{N(1-e^{j(2\pi/N)k}z^{-1})} = \frac{1}{N}\frac{\prod_{i=0}^{N-1}(z-e^{j(2\pi/N)i})}{z^{N-1}(z-e^{j(2\pi/N)k})}$$

H(z) for the filter will also have zeros at +1 and −1 (corresponding to $\omega=0$ and $\pi$ rad/sec). Examples are shown in FIGS. 6 and 7 for k=1 and 2 respectively; zeros are marked by circles, poles by crosses, and the horizontal and vertical axes represent the real and imaginary components respectively: note the "missing zero" at $\omega=2\pi/N$ (FIG. 6) and $\omega=2(2\pi/N)$ (FIG. 7).

Figure 6:
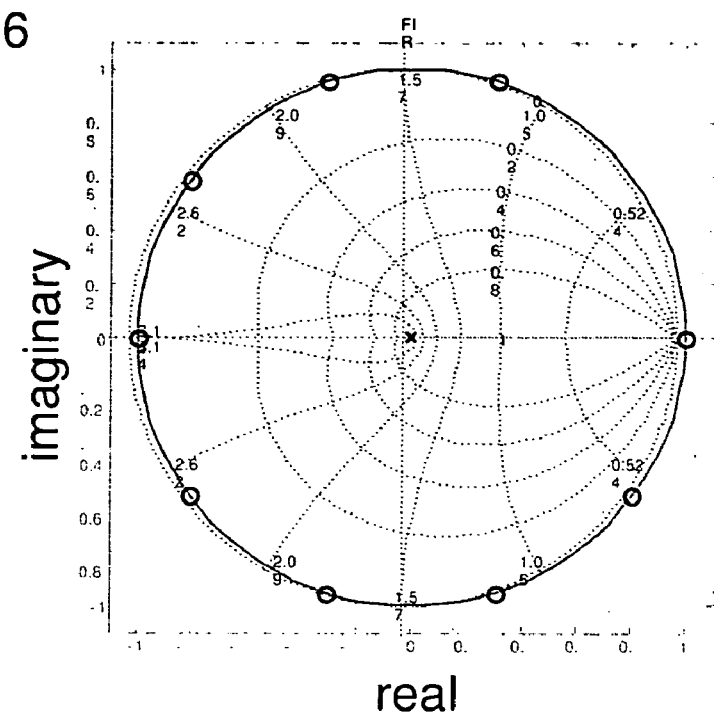
FIGS. 6 and 7 depict z-plane plots of the transfer function H(z) for filters k=1 and k=2.
Figure 7:
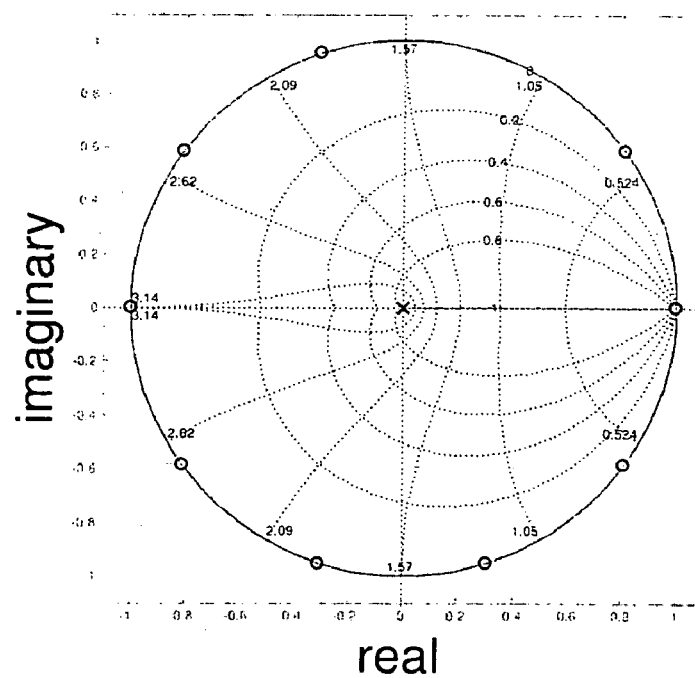

When a sinusoid with a frequency of $\omega=2\pi/N$ is input to the filter of FIG. 6, the output of the filter is complex. This is due to the fact that one complex zero is present without a complex conjugate counterpart. This in turn means that the coefficients of the FIR filter are complex. Hence, the output of the filter is complex, even if the input is real. The real and complex part of the filter output can be used to discover the actual phase of the input signal, in the following way. Assume an input signal having equispaced frequency components as described before:

$$x(t) = \sum_{i=1...m} a_i\cos(\omega_i t) + b_i\sin(\omega_i t)$$

Inputting this signal in the kth filter results in all frequencies except the kth harmonic being filtered out by the zeros in the filter. The remaining sinusoid (hence with i=k) results in a complex filter output:

$$y_k(t) = \frac{1}{2}(\alpha_k(t) - j\beta_k(t))$$

The real and complex filter output are related to the original input by:

$$a_k=\alpha_k\cos(\omega_k t)+\beta_k\sin(\omega_k t)$$

$$b_k=\alpha_k\sin(\omega_k t)-\beta_k\cos(\omega_k t)$$

In other words, by applying the above equation to the real and complex filter output parts, coefficients $a_k$ and $b_k$ appear that describe the original sinusoidal input.

When the input parameters are known, the spectral components in the input can be reconstructed by means of $$x(t) = \sum_{i=1\ldots m} a_i \cos(\omega_i t) + b_i \sin(\omega_i t)$$

Now that an analytic form has been derived, a prediction of the input signal is possible by substituting t by t+ΔT.

Figure 8:
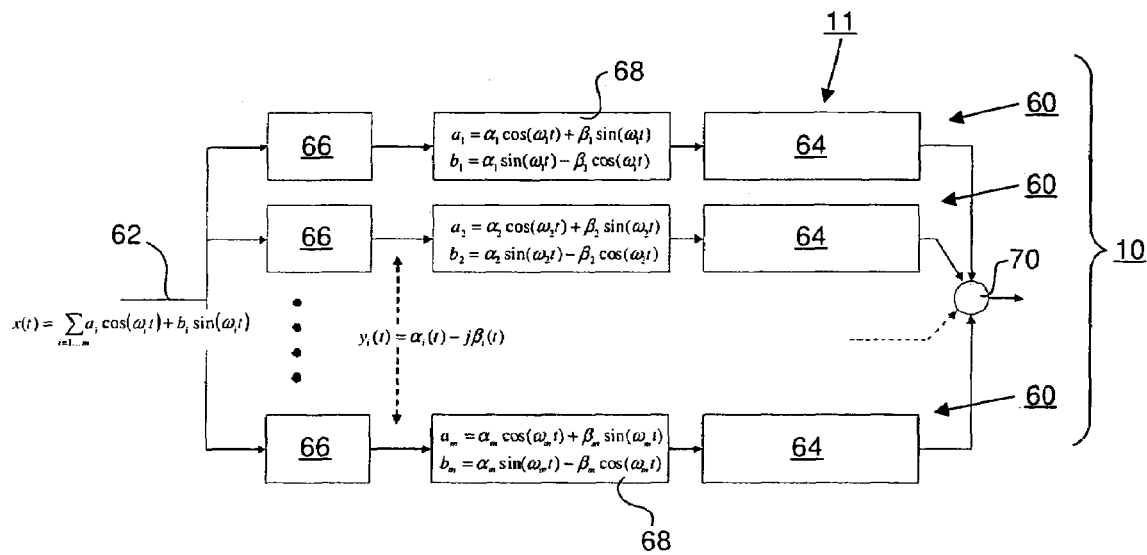
FIG. 8 depicts a plurality of filter branches for prediction of a signal including equispaced frequencies.

FIG. 8 summarizes the functional units of the plurality of filter branches 10 (including individual branches 60) and the prediction unit 11 (in this case made up from a plurality of calculation units 64). The filter branches 60 are configured each to act on an input derived from an output 62 from the measurement system 14 and determine therefrom an amplitude and phase of one of a plurality of pre-determined frequency components. An evolution of the frequency component is obtained by calculation unit 64 using an analytical form for the frequency component derived based on the amplitudes and phases extracted by the filter branches 60. In the present embodiment, the input signal is assumed to consist of m sinusoids with equispaced frequencies. The $i^{th}$ filter only passes $\omega_i$. From the filter's complex output (see boxes 68), the a and b coefficients of this particular sinusoid can be determined. Then, knowing these parameters, reconstruction of this specific frequency can be accomplished and prediction of the signal is possible. The final output is then created by summing all reconstructed/predicted signals at output 70. According to this embodiment, the prediction step is carried out by calculation units 64 in combination with the output 70 (which acts to combine the frequency components).

Modifying FSF's for Feedforward Prediction in the Case of Arbitrary Frequency Contributions The above-described technique may be used for prediction purposes. Once the coefficients $a_k$ and $b_k$ are determined, a prediction of the input signal can be made by inserting a future time instant in the signal reconstruction part:

$$x(t+T) = \sum_{i=1\ldots m} a_i \cos(\omega_i(t+T)) + b_i \sin(\omega_i(t+T))$$

However, application to the described lens feedforward (FIGS. 2 and 3) and substate table WT to support MT feedthrough (FIGS. 4 and 5) is hindered by the fact that the main frequency components in the input signal are not equispaced. For example, in the lens acceleration signal, 95, 210 and 270 Hz are found to be the main components in one particular arrangement. The description below explains how the method can be extended to arbitrary frequencies instead of equispaced frequencies. This extension provides increased flexibility to the time lag compensating functionality of the control system 2.

Effects of the method in the frequency domain are analyzed in order to describe the modifications that are required for arbitrary frequencies.

The formula linking H(z) to H(k) mentioned above, $$H(z) = \frac{1 - z^{-N}}{N} \sum_{k=0}^{N-1} \frac{H(k)}{1 - e^{j(2\pi/N)k} z^{-1}}$$

is only valid for equispaced frequencies, because H(k) corresponds to components in a discrete Fourier transform, which utilizes equispaced frequencies by definition. Hence, applying the same formulae with arbitrary frequencies does not directly lead-to a useful result. In particular, if the equispaced frequencies 2π/N in the original equation are replaced by arbitrary frequencies $\omega_k$:

$$H_k(z) = \frac{1-z^{-N}}{N(1-e^{j(2\pi/N)k}z^{-1})} = K \frac{\prod_{i=0}^{N-1}(z-e^{j(2\pi/N)i})}{z^{N-1}(z-e^{j(2\pi/N)k})}$$

then becomes:

$$H_k(z) = K \frac{\prod_{i=0}^{N-1}(z-e^{j\omega_i})}{z^{N-1}(z-e^{j\omega_k})}$$

In this filter, the response is no longer 1 at $\omega=\omega_k$: a specific gain K and phase φ are present. First, this means that the gain should be corrected to 1 by dividing the filter output by K. Second, in the approach described above using the equation $$a_k = \alpha_k \cos(\omega_k t) + \beta_k \sin(\omega_k t)$$

$$b_k = \alpha_k \sin(\omega_k t) - \beta_k \cos(\omega_k t)$$

the coefficients $a_k$ and $b_k$ are no longer found. It appears that the outcome of the calculation yields $a_k$ and $b_k$ that are still constant for $\omega=\omega_k$, but do not represent the actual input signal coefficients. It is found that the $a_k$ and $b_k$ from the above equation are rotated by $-\phi$ with regard to the actual coefficients, and hence a rotation over an angle $+\phi$ leads to correct coefficients $a'_k$ and $b'_k$:

$$a'_k = a_k \cos(\phi) - b_k \sin(\phi)$$

$$b'_k = a_k \sin(\phi) + b_k \cos(\phi)$$

According to an embodiment of the invention adapted to deal with arbitrary frequencies in the input signal instead of the equispaced frequencies discussed above, the following modifications are applied:

The same filter structure is used, the equispaced frequencies being replaced by the arbitrary frequencies The gain and phase of each filter at its frequency is determined (by filling in $z=e^{j\omega T}$)

The filter output is corrected by division by the filter gain (which is no longer 1, or N, depending how you look at it))

The output of the sine coefficient calculated ($a_k$ and $b_k$) is rotated over the filter phase angle.

Figure 9:
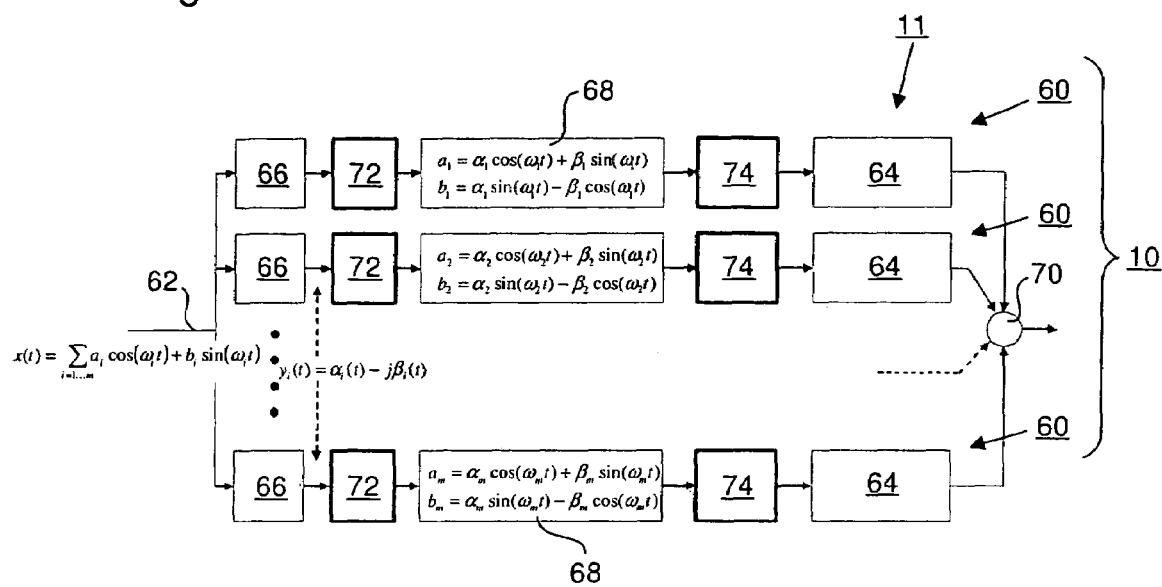
FIG. 9 depicts a plurality of filter branches for prediction of a signal including non-equispaced frequencies.

FIG. 9 shows the arrangement of FIG. 8 adapted to process input signals with arbitrary frequency components. Two additional components are provided in each filter branch 60: the normalization unit 72, configured to divide the amplitude of the predetermined frequency component by the gain of the filter unit 66 at the frequency of the frequency component; and a phase rotation unit 74 configured to rotate the phase of the pre-determined frequency component to correct for phase offset introduced by the filter unit at the frequency of the frequency component.

Example of Input Signal with Non-Equispaced Frequency Components

Figure 10:
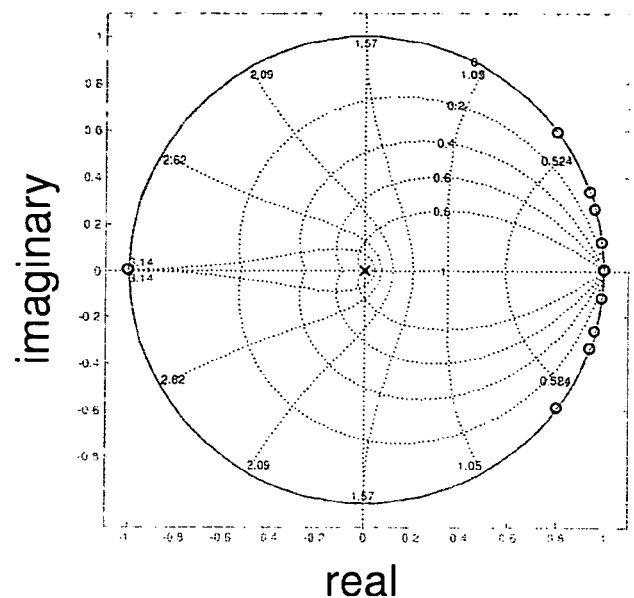
FIG. 10 depicts a z-plane plot of the zero and pole positions for non-equispaced frequencies.

As an example, frequencies 95, 210, 270 and 500 Hz are assumed to be present in the feedforward signal. A sample frequency of 5 kHz is used, making $T_s$=2e-4 sec. FIG. 10 shows all zeros corresponding to these frequencies, and the added zeros at +1 and −1. All 10 poles are in z=0.

Figure 11A:
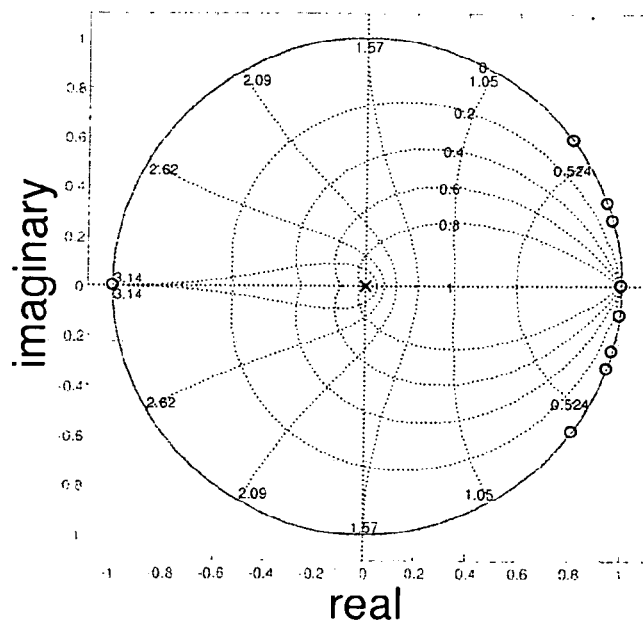
FIG. 11a-d depict z-plane plots of the transfer functions H(z) for filters adapted to filter various ones of the non-equispaced frequencies of FIG. 10.
Figure 11B:
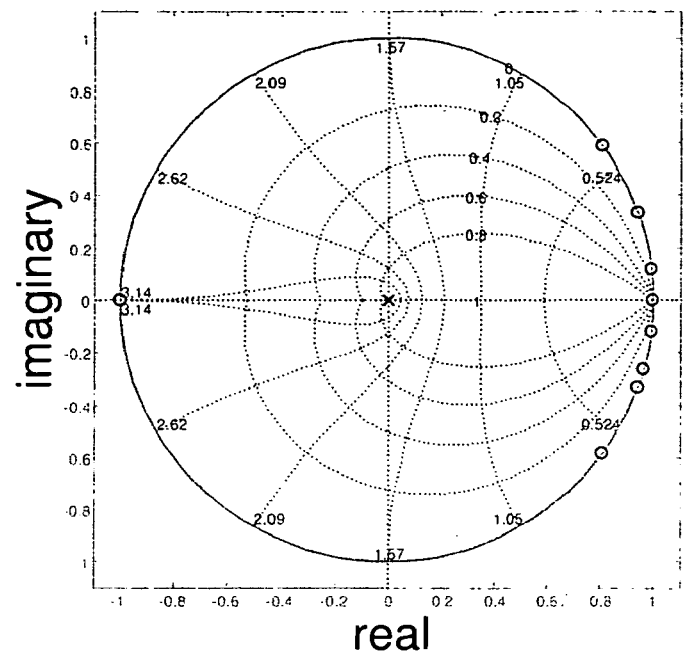
Figure 11C:
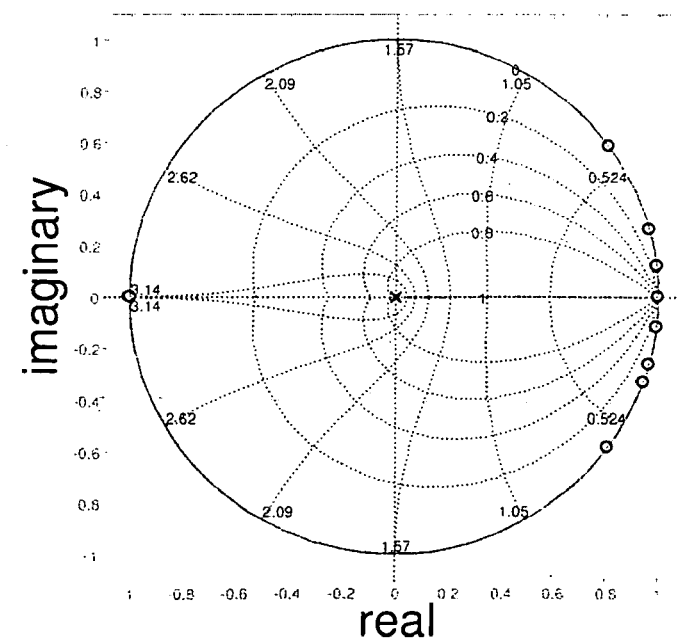
Figure 11D:
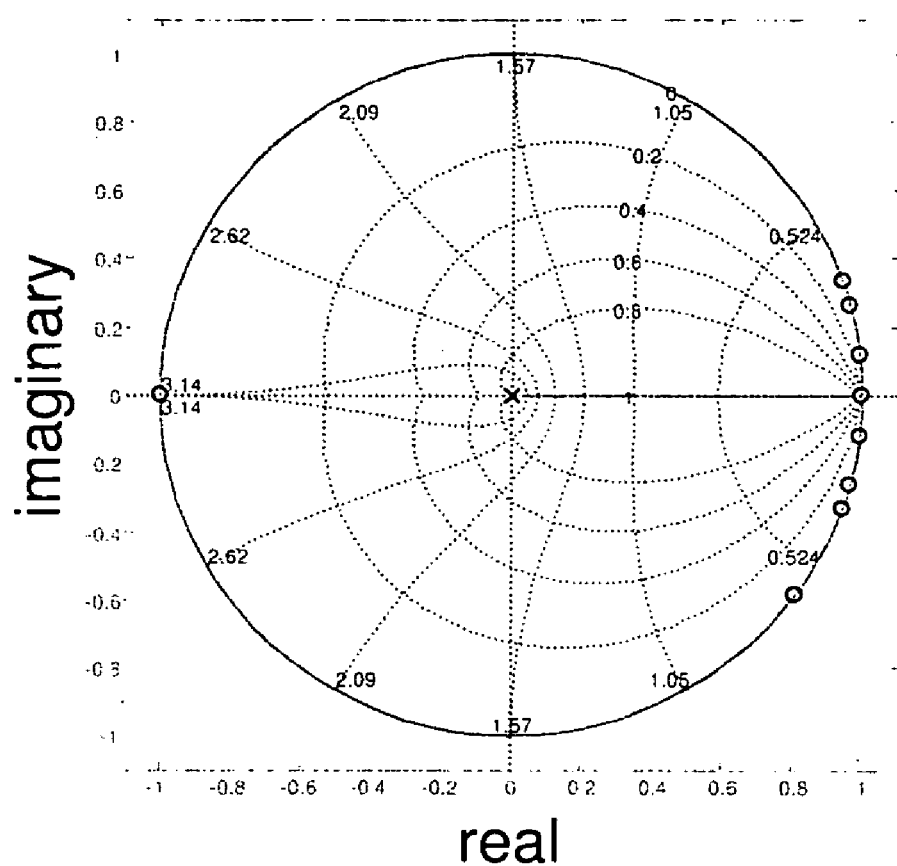

Because four frequencies are present in the feedforward signal, four FIR filters will be designed, each one of them missing one of the zero's in FIG. 10. These four filters are shown in FIGS. 11a (95 Hz), 11b (210 Hz), 11c (270 Hz) and 11d (500 Hz). To the four filters, a signal is input that is a combination of the four sinusoids, with amplitudes of 1, ½, ⅓, and ¼, respectively, representing the signal that needs to be predicted:

$$x(t) = 1 \times \sin(2\pi \cdot 95 \cdot t) + \frac{1}{2} \times \sin(2\pi \cdot 210 \cdot t) + \frac{1}{3} \times \sin(2\pi \cdot 270 \cdot t) + \frac{1}{4} \times \sin(2\pi \cdot 500 \cdot t)$$

The complex outputs of the filters are divided by the filter gains; the coefficients $a_k$ and $b_k$ are determined, and these are rotated over angles $\phi_k$ to produce $a_k'$ and $b_k'$, as described above. Finally, a 1-sample prediction is performed by using:

$$x(t+T) = \sum_{i=1\ldots m} a_i \cos(\omega_i(t+T)) + b_i \sin(\omega_i(t+T))$$

Figure 12A:
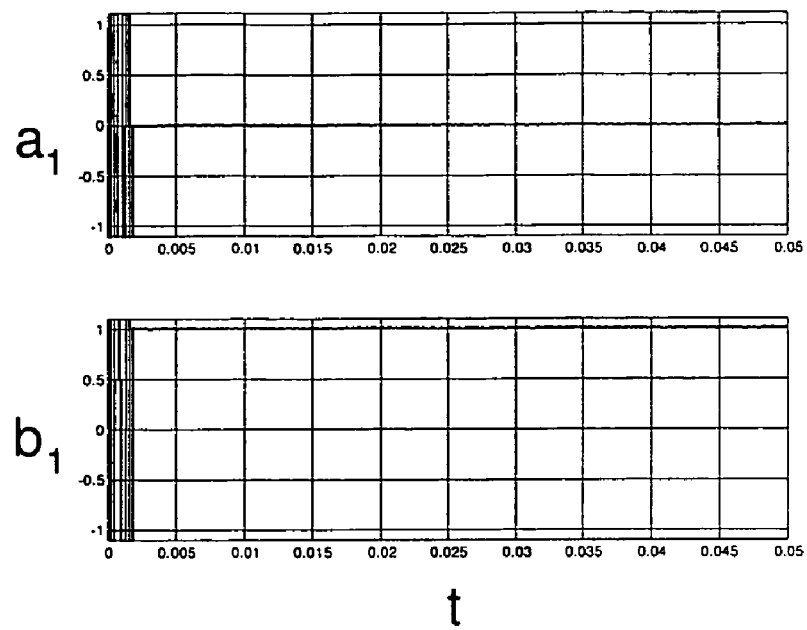
FIG. 12a-d show graphs of filter convergence on the a and b coefficients of the input sinusoidal signal when poles of the filter transfer functions are at z=0.
Figure 12B:
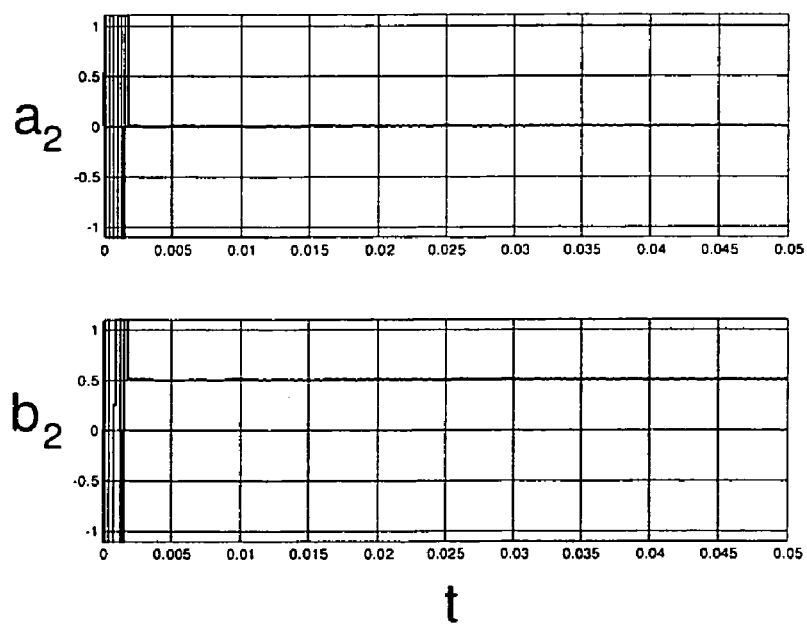
Figure 12C:
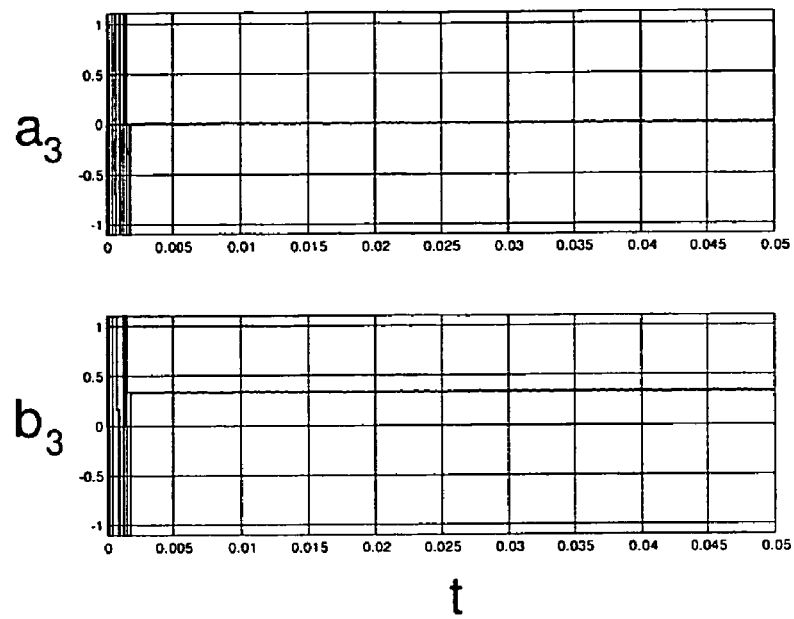
Figure 12D:
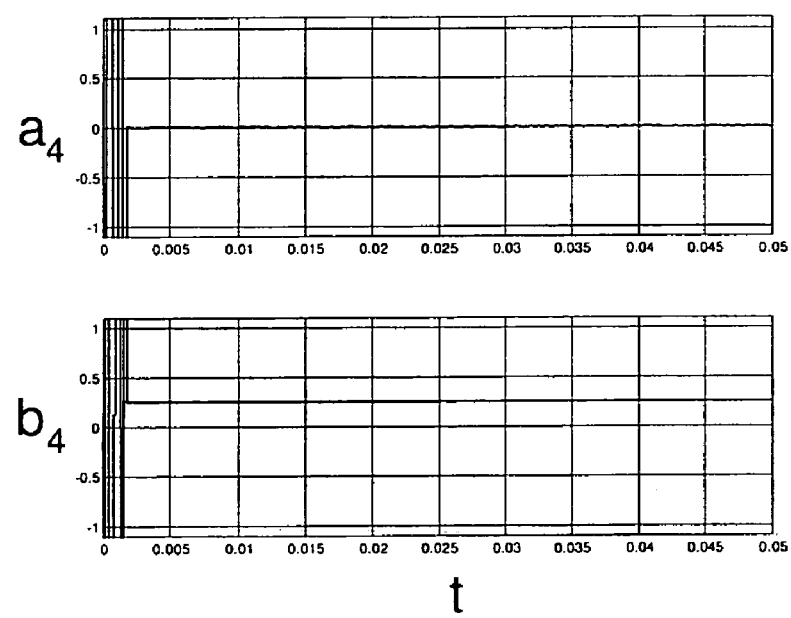

First, the estimation of the $a_k'$ and $b_k'$ coefficients is shown, in FIGS. 12a-d. The vertical axes in each upper figure represents $a_k'$ and the vertical axes in each lower figure represent $b_k'$. The horizontal axes represent time, in seconds. It can be seen that after 10 initial samples, all coefficients are found consistently. It can also be seen that the first 9 samples produce unusable data. FIG. 12a shows the coefficients found by the first filter; FIG. 12b shows the coefficients found by the second filter; FIG. 12c shows the coefficients found by the third filter; FIG. 12d shows the coefficients found by the fourth filter.

Figure 13:
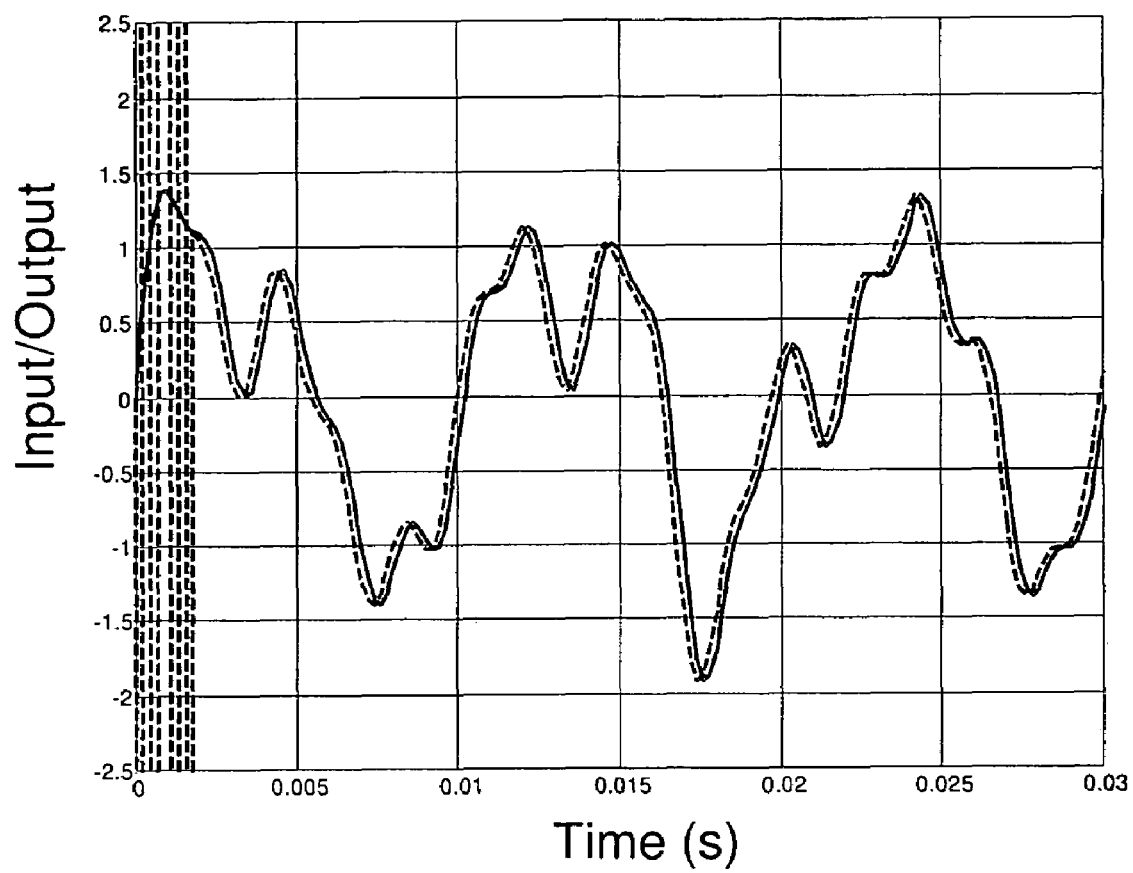
FIG. 13 shows convergence of a prediction of an input signal by a plurality of filter branches and the input signal itself in the case where the poles of the filter transfer functions are at z=0.

FIG. 13 compares the resulting predicted signal and the actual signal, illustrating the close match for the 10th sample onwards; the solid line represents the input signal and the broken line the predicted signal (output).

Frequency Responses and Settling Behavior

Although the predictor is exact for signals containing only the projected sinusoidal components, it is also desirable to know how the predictor behaves for other frequencies. It can be shown that, generally, a predictor will tend to exhibit higher gain at higher frequencies, due to the "differentiating" nature of the predictor. The filter embodiments discussed above show perfect gain and phase behavior in the transfer function at the prediction frequencies. However, a cost of this is excess gain at higher (non-prediction) frequencies. This high-frequency behavior is the result of the same filter characteristics that also produce the undesirable settling behavior shown in the previous paragraph (i.e., the behavior of the first 9 samples).

Figure 14A:
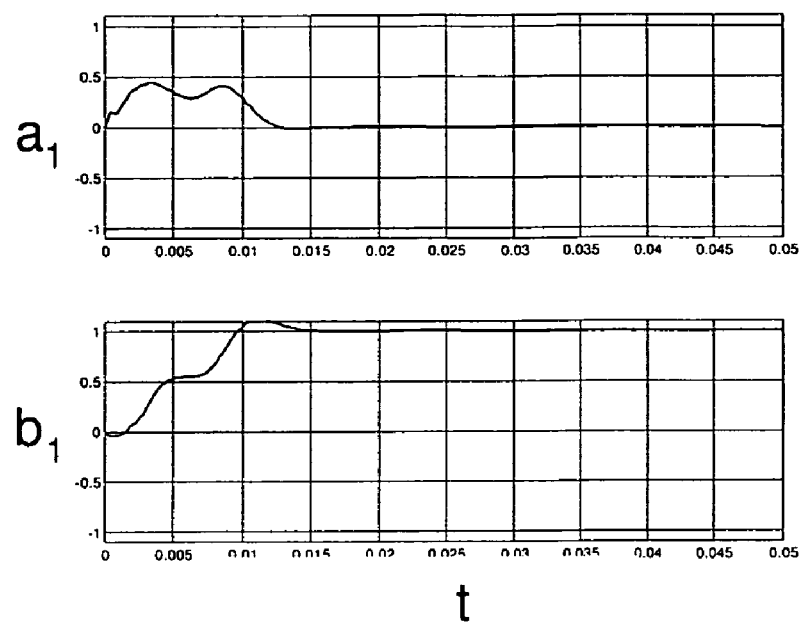
FIG. 14a-d show graphs of filter convergence on the a and b coefficients of the input sinusoidal signal when poles of the filter transfer functions are at z>0 and real.
Figure 14B:
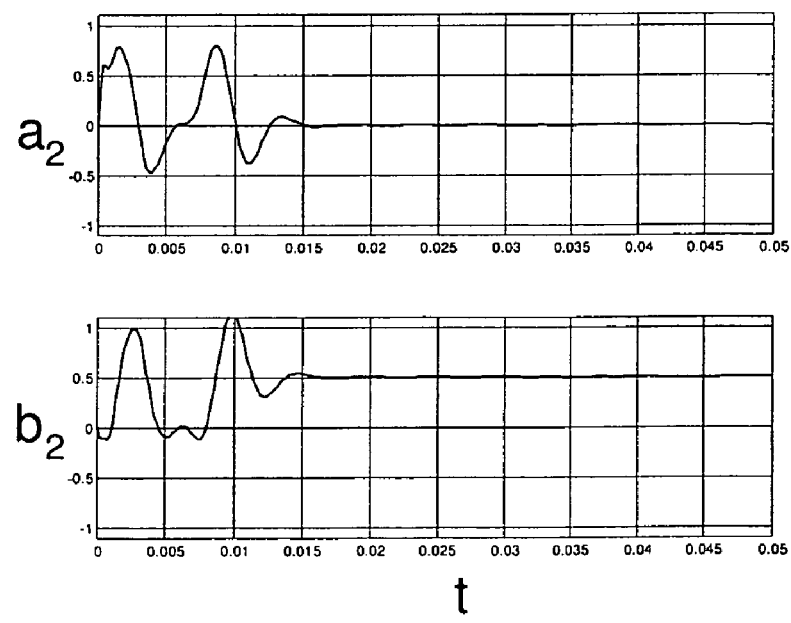
Figure 14C:
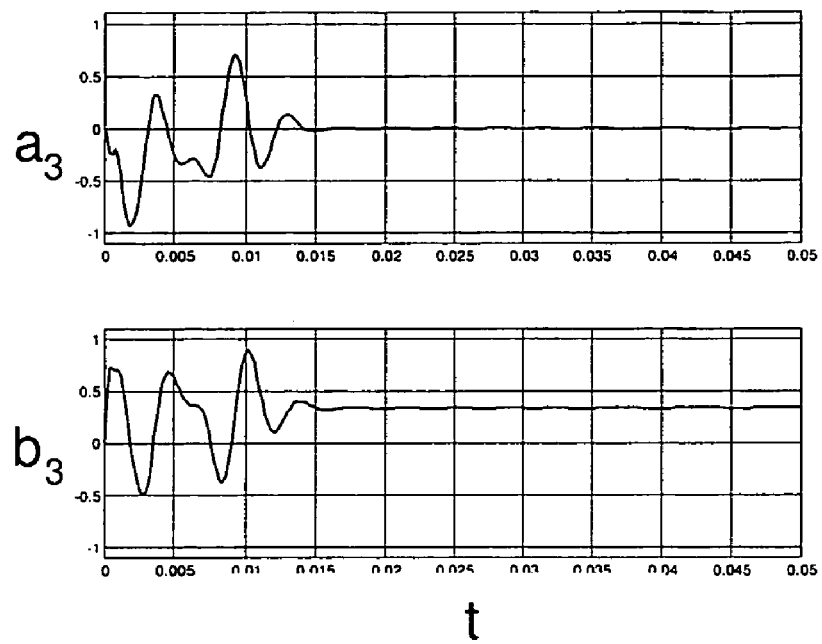
Figure 14D:
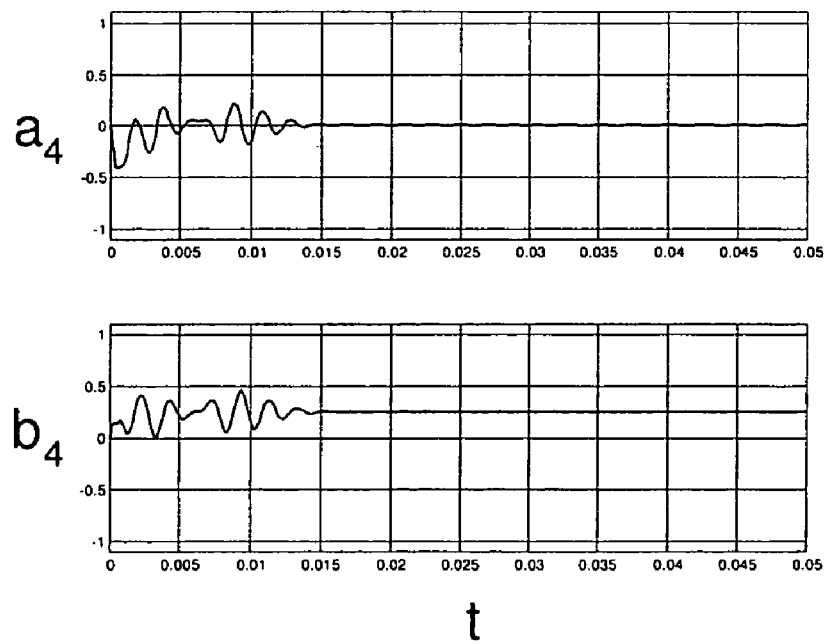
Figure 15:
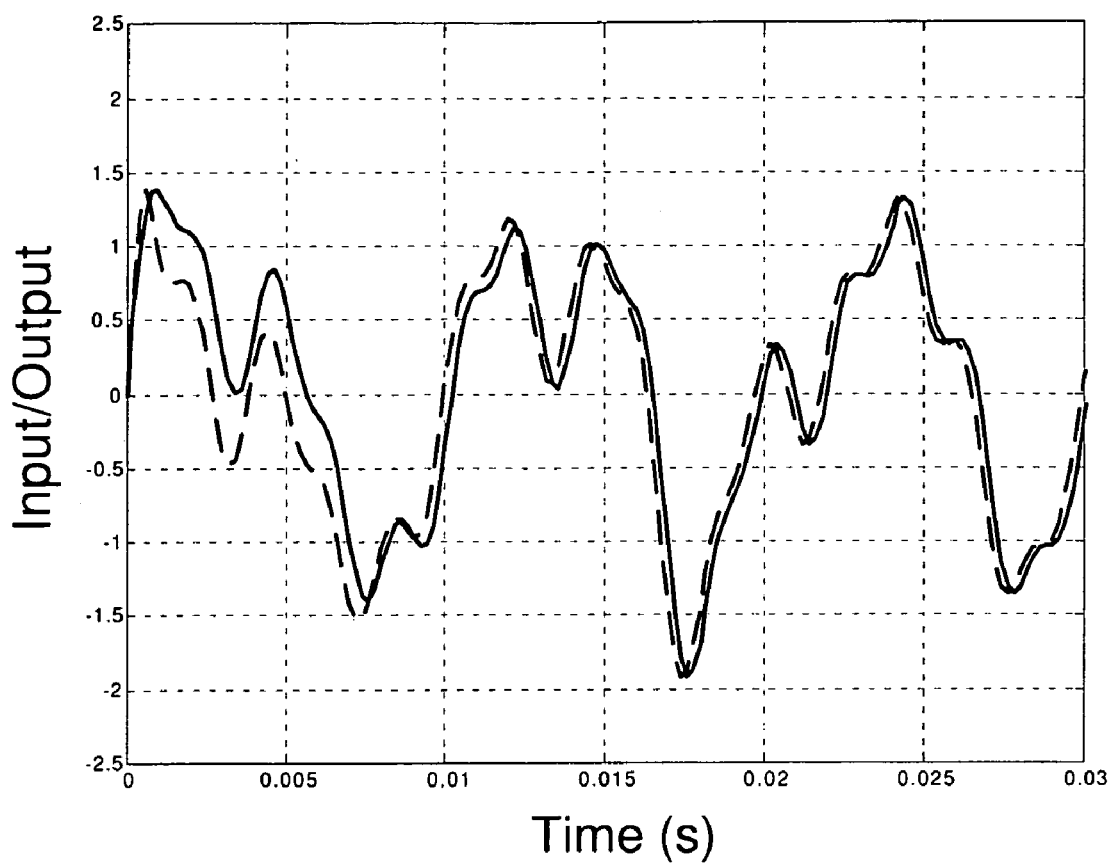
FIG. 15 shows convergence of a prediction of an input signal by a plurality of filter branches and the input signal itself in the case where the poles of the filter transfer functions are at z>0 and real.

The settling performance of the filters as well as their response at frequencies other than the prediction frequencies may be improved by adapting the choice of the pole locations in the filter transfer functions. In the filter embodiments discussed above, all poles are positioned in the origin, resulting in a FIR filter. By shifting the poles to the right on the real axis, a low-pass characteristic is created in each filter (which is then not a FIR filter any more). The phase lag introduced by this low-pass characteristic is again compensated by using the actual phase lag in the calculation of $a_k'$ and $b_k'$. So, at the specified frequencies, the prediction is still exact. However, the effect of shifting the poles in this way dramatically reduces the extra gain seen at higher frequencies. For example, by shifting all poles from z=0 to z=0.75, it can be seen that prediction at the specified frequencies is still exact, but for higher frequencies the extra gain is reduced to less than 7 dB (from greater than 100 dB with poles at z=0). Furthermore, settling behavior is greatly improved. Although the number of samples needed to reach a final value increases, the startup behavior is much smoother than before, thus reducing the sensitivity of the filters to changes in the characteristics of the input signal. This behavior can be seen from the estimation of the $a_k'$ and $b_k'$ coefficients shown in FIGS. 14a-d for the case where poles are at z=0.75. The plots correspond to those shown in FIGS. 12a-d and have the same axes: FIG. 14a shows the coefficients found by the first filter; FIG. 14b shows the coefficients found by the second filter; FIG. 14c shows the coefficients found by the third filter; FIG. 14d shows the coefficients found by the fourth filter. FIG. 15 shows the input signal (solid) and predicted signal (broken) corresponding to FIG. 13 but showing the predictor behavior related to the new pole locations. It shows that during the first samples a less extreme behavior is present.

Figure 16:
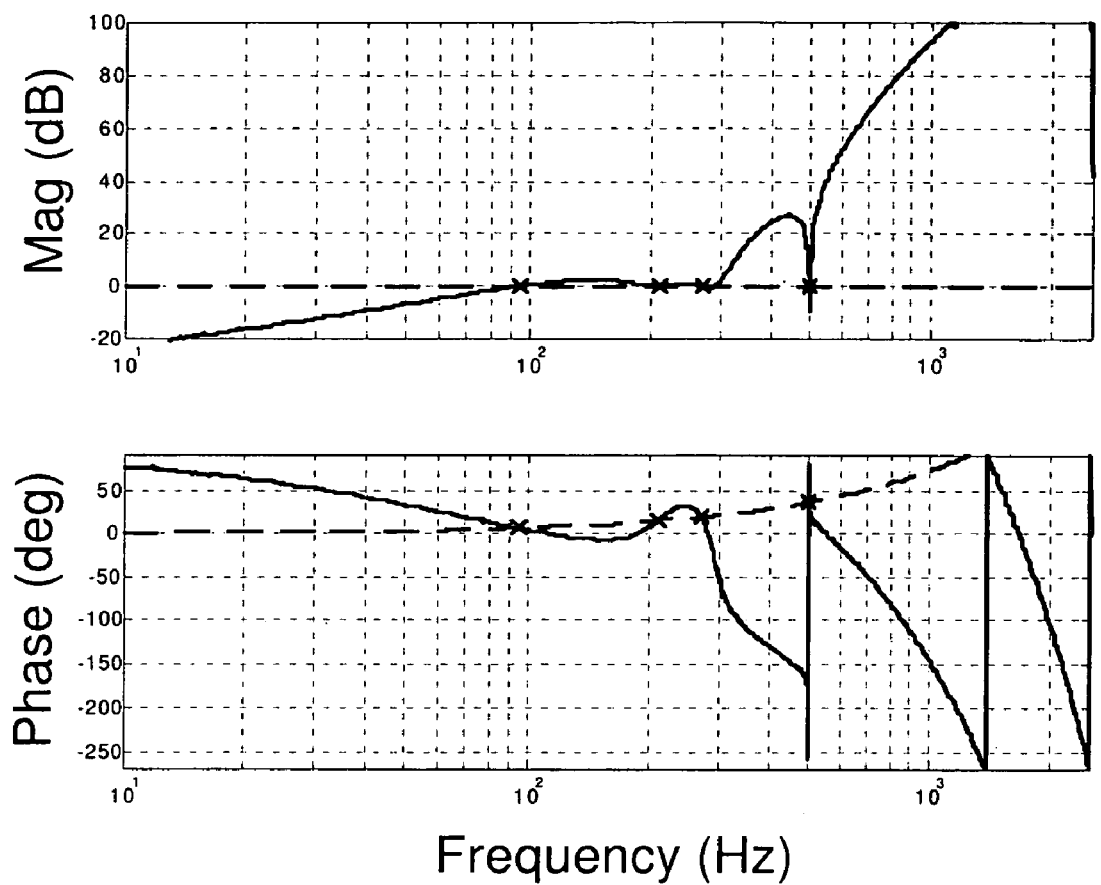
FIG. 16 shows the frequency response of the plurality of filter branches compared to the ideal frequency response.
Figure 17:
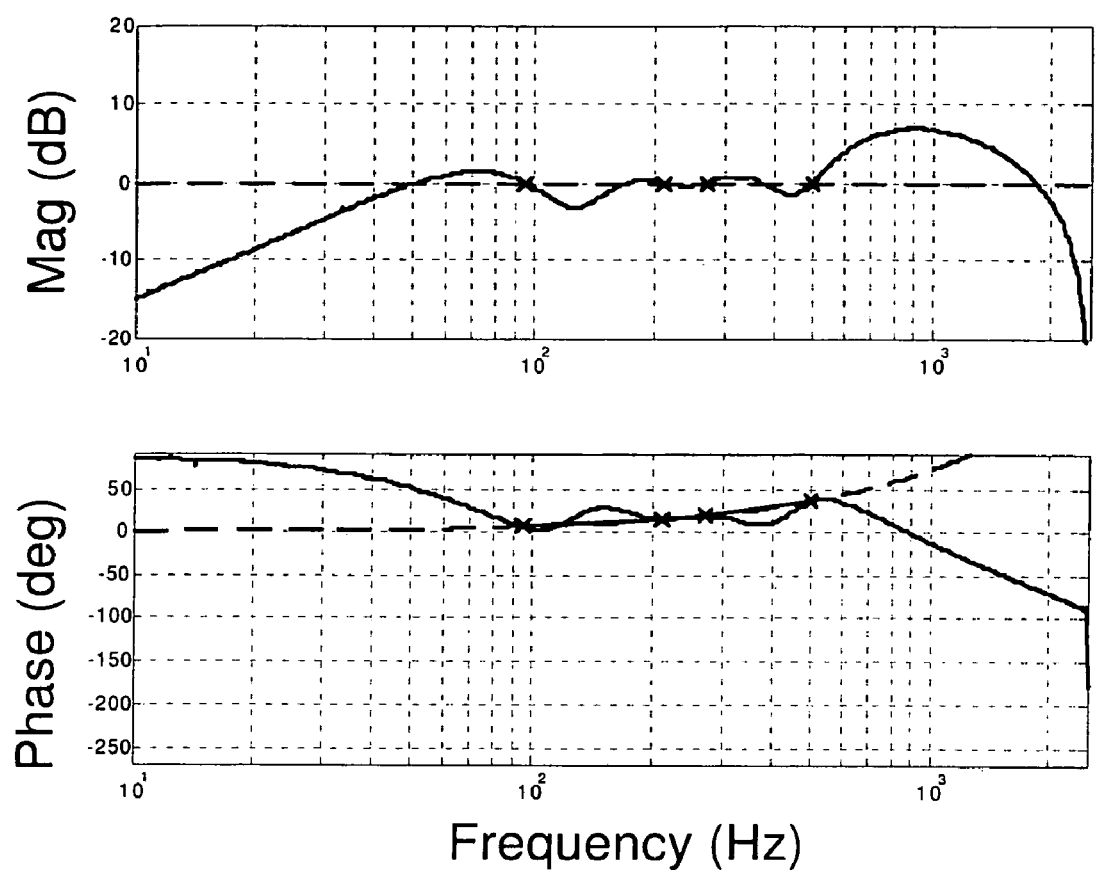
FIG. 17 shows the frequency response of the plurality of filter branches compared to the ideal frequency response for modified pole locations.

FIG. 16 shows the frequency response of the predictor (the drawn line) compared to the ideal frequency response (the dashed line). It is shown that at the design frequencies of 95, 210, 270 and 500 Hz (indicated by crosses) the actual behavior exactly matches the desired behavior both in magnitude (top window) and phase (bottom window). However, especially for higher frequencies, the magnitude of the predictor is much larger than it would ideally be. In FIG. 17, the actual and desired predictor behaviors are shown for the modified pole locations as described above, with z=0.75. It can be seen that the magnitude of the predictor response is now much closer to the ideal line for frequencies other than the design frequencies. At the design frequencies, the behavior is still exact: the actual predictor behavior matches the ideal behavior exactly.

Acceleration Prediction

In some occasions, it is useful to combine the predictor with other functions, such as a single or double differentiator. For example, in substrate table WT to support MT for patterning device MA feedthrough, the substrate table WT position error is differentiated twice, resulting in 1 sample delay (see stage 40 in FIG. 5). If the substrate table WT position error is assumed to consist of a number of sinusoids, and the coefficients of these sinusoids can be found by the plurality of filter branches, as discussed above, it is possible directly to calculate the single or doubly differentiated input of the filter. For example, in the case of double differentiation and with a time shift of T:

$$\ddot{x}(t+T) = \sum_{i=1\ldots m} -a_i \omega_i^2 \cos(\omega_i(t+T)) - b_i \omega_i^2 \sin(\omega_i(t+T))$$

Even without the time-shifting step (i.e. with T=0), the arrangement already has a benefit in that it avoids the time delay associated with having a separate filter for double differentiation; this immediately provides a 1 sample advantage as it creates a zero-delay doubly differentiated signal. Adding time-shifting further improves the performance by compensating for any residual delay.

To force the low-frequency behavior towards a +2 slope that describes the behavior of an exact double differentiator, a low frequency (for example, 10 Hz) can be added to the existing frequencies. This way, the predictor response will show a "double differentiating" behavior also for low frequencies, and large deviations from a +2 slope are avoided at least up to 10 Hz. For lower frequencies, the double-differentiating behavior is generally less important, because any deviations can be tackled properly by the controller itself. In other words, the feedforward accuracy is most desirable in frequency regions where the position controller itself cannot cope properly with disturbances. Also, a better frequency response is found by shifting the poles (for example, to z=0.65). The acceleration-predictor frequency response thus obtained has a modest high-frequency gain away from the prediction frequencies as desired, especially for large z; the prediction is always exact at the chosen frequencies, and the overall frequency response is smooth. For smaller values of the pole's real parts, the high-frequency gain becomes larger, but the match with the ideal behavior for lower frequencies (other than the design frequencies) becomes better. The positions of the poles may thus be tuned to achieve a desired compromise between high-frequency gain and filter behavior for frequencies that are not in the design.

Figure 18:
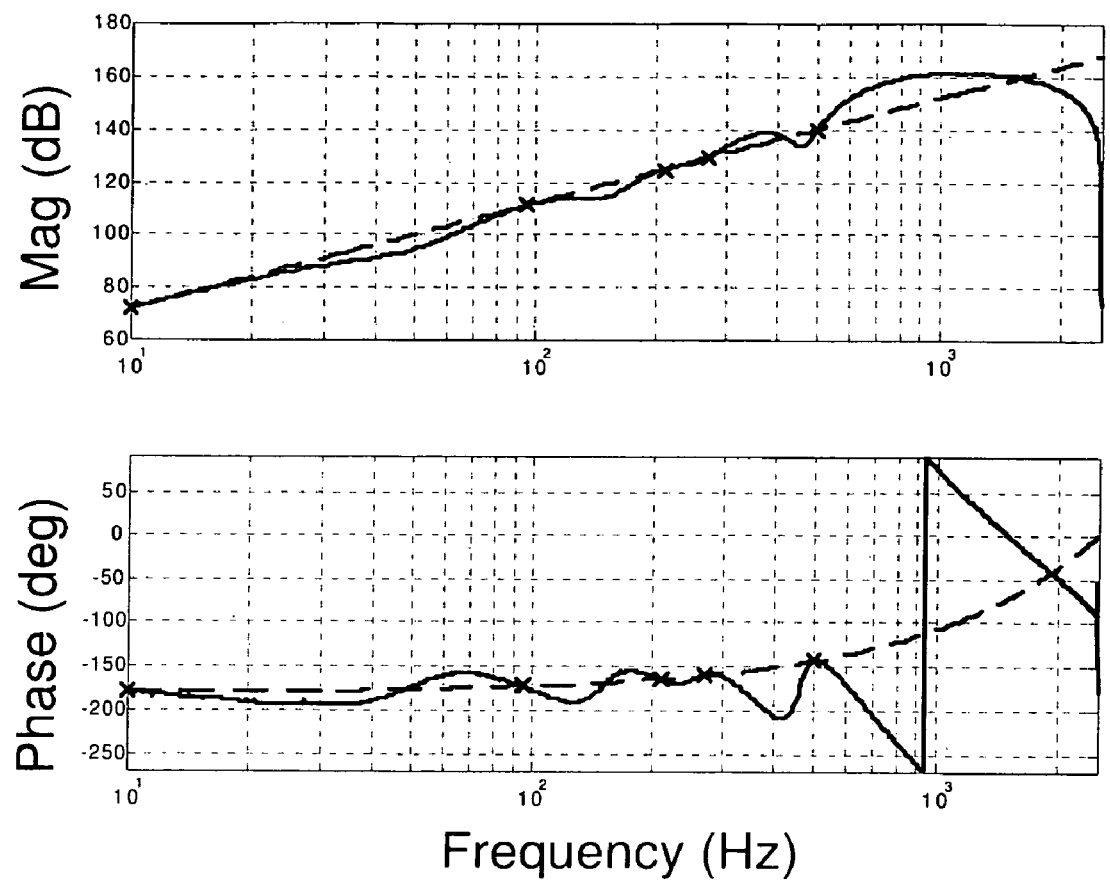
FIG. 18 shows the frequency response of the plurality of filter branches configured to predict a double time derivative of the input.

FIG. 18 shows the actual frequency response of the predictor, predicting the double derivative of its input (drawn line), and the ideal behavior (dashed line). It can be seen that at the design frequencies (indicated by crosses), both the magnitude and phase behavior match the ideal behavior exactly. Outside these frequencies, the predictor behavior is still close to the ideal case, and the maximum gain over the ideal line for higher frequencies is limited.

This method can be used to predict signals consisting of a combination of sinusoids, while allowing only a small increase in gain in the high-frequency area. In that sense, this prediction method offers a better behavior than that implemented according to the prior art.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. Also, the method may be used to with other signal descriptions besides the described sinusoids, for example the signal to be predicted may be described by a series of exponential functions or other analytical functions, of which the characteristic parameters are extracted by means of a plurality of filters, before being used by a prediction unit to generate a predicted version of the input. The predetermined frequencies in such a case could be replaced by another independent predetermined variable.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a first moveable component;
an actuator configured to move said first component relative to a second component;
a measurement system constructed and arranged to measure at least one of the following properties of said second component: a position, a velocity, an acceleration and higher order time derivatives of the position; and
a control system configured to control said actuator according to an output of said measurement system, wherein said control system comprises:
a plurality of filter branches, each filter branch configured to act on an output of said measurement system and determine therefrom characteristic parameters of a different one of a plurality of pre-determined independent variables of a first analytical expression of said output of said measurement system; and
a prediction unit configured to use said characteristic parameters determined by said plurality of filter branches and said first analytical expression to provide a version of said output that is time-shifted to at least partially compensate for a delay between a measurement of a property of said second component by said measurement system and the effect of said measurement on an operation of said actuator as controlled by said control system;
wherein said independent variables comprise frequency components and said characteristic parameters comprise amplitude and phase of said frequency components; and
wherein each filter branch comprises:
a filter unit;

a normalization unit configured to divide said amplitude of the pre-determined frequency component by a gain of said filter unit in said filter branch at the frequency of said frequency component; and a phase rotation unit configured to rotate the phase of the filter output in the complex plane to correct for a phase offset introduced by said filter unit at the frequency of said frequency component.

2. A lithographic apparatus, comprising:

a first moveable component;

an actuator configured to move said first component relative to a second component;

a measurement system constructed and arranged to measure at least one of the following properties of said second component: a position, a velocity, an acceleration and higher order time derivatives of the position; and a control system configured to control said actuator according to an output of said measurement system, wherein said control system comprises:

a plurality of filter branches, each filter branch configured to act on an output of said measurement system and determine therefrom characteristic parameters of a different one of a plurality of pre-determined independent variables of a first analytical expression of said output of said measurement system; and a prediction unit configured to use said characteristic parameters determined by said plurality of filter branches and said first analytical expression to provide a version of said output that is time-shifted to at least partially compensate for a delay between a measurement of a property of said second component by said measurement system and the effect of said measurement on an operation of said actuator as controlled by said control system;

wherein said independent variables comprise frequency components and said characteristic parameters comprise amplitude and phase of said frequency components; and wherein each filter branch has a filter unit defined in the z-plane by a transfer function H(z), said transfer function H(z) having complex conjugate pairs of zeros at positions on the unit circle of z=1 that correspond to each one of said predetermined frequency components except the frequency component for which the filter branch is configured to determine the amplitude and phase, for which H(z) has only one of a complex conjugate pair of zeros on said unit circle.

3. A lithographic apparatus according to claim 2, wherein the transfer function H(z) for each filter unit has at least one pole at z=0.

4. A lithographic apparatus according to claim 2, wherein the transfer function H(z) for each filter unit has at least one pole at z=p, where the real part of p is positive and non-zero.

5. A lithographic apparatus, comprising:

a first moveable component;

an actuator configured to move said first component relative to a second component;

a measurement system constructed and arranged to measure at least one of the following properties of said second component: a position, a velocity, an acceleration and higher order time derivatives of the position; and a control system configured to control said actuator according to an output of said measurement system, wherein said control system comprises:

a plurality of filter branches, each filter branch configured to act on an output of said measurement system and determine therefrom characteristic parameters of a different one of a plurality of pre-determined independent variables of a first analytical expression of said output of said measurement system; and a prediction unit configured to use said characteristic parameters determined by said plurality of filter branches and said first analytical expression to provide a version of said output that is time-shifted to at least partially compensate for a delay between a measurement of a property of said second component by said measurement system and the effect of said measurement on an operation of said actuator as controlled by said control system;

wherein each filter branch includes a filter unit, and wherein each filter unit is defined in the z-plane by a transfer function H(z), said transfer function H(z) having complex conjugate pairs of zeros at positions on the unit circle of |z|=1 that correspond to the corresponding pre-determined independent variable.

6. A device manufacturing method, comprising:

moving a first component relative to a second component with an actuator;

measuring at least one of the following properties of said second component:

position, velocity, acceleration and higher order time derivatives of the position with a measurement system; and controlling said actuator according to an output of said measurement system with a control system, said control system comprising:

a plurality of filter branches, each branch acting on an output of said measurement system and determining therefrom characteristic parameters of a different one of a plurality of pre-determined independent variables of a first analytical expression of said output from said measurement system; and a prediction unit that uses said characteristic parameters determined by said plurality of filter branches and said first analytical expression to provide a version of said output that is time-shifted to at least partially compensate for a delay between a measurement of a property of said second component by said measurement system and the effect of said measurement on an operation of said actuator as controlled by said control system;

wherein each filter branch includes a filter unit; and wherein each filter unit is defined in the z-plane by a transfer function H(z), said transfer function H(z) having complex conjugate pairs of zeros at positions on the unit circle of |z|=1 that correspond to the corresponding pre-determined independent variable.

* * * * *